United States Patent [19]

Climer et al.

[11] Patent Number: 5,541,564
[45] Date of Patent: Jul. 30, 1996

[54] HYBRID R-C COMPONENT HAVING AN OVERLYING DIELECTRIC LAYER

[75] Inventors: Eugene J. Climer, Salem; Wayne D. Thomas, Tigard, both of Oreg.

[73] Assignee: Tektronix, Inc., Wilsonville, Oreg.

[21] Appl. No.: 492,594

[22] Filed: Jun. 20, 1995

[51] Int. Cl.⁶ ................................................ H03H 7/06
[52] U.S. Cl. ...................... 333/172; 324/72.5; 361/301.4; 361/313
[58] Field of Search ........................... 333/172; 324/72.5; 29/25.42; 361/301.4, 313, 728, 766, 782, 821

[56] References Cited

U.S. PATENT DOCUMENTS 3,398,326   8/1968   Swart et al. ..................... 361/766 X
3,427,572   2/1969   Rayburn ............................ 333/172

OTHER PUBLICATIONS

Wright, "Monolithic RC Filters", IBM Technical Disclosure Bulletin, vol. 16, No. 6, pp. 1728–1729.

*Primary Examiner*—Benny Lee
*Assistant Examiner*—Justin P. Bettendorf
*Attorney, Agent, or Firm*—Boulden G. Griffith

[57] ABSTRACT

A hybrid R-C component for use in oscilloscope probes of the type having a resistive element disposed on a first surface of a substrate, and having a first conductive coating disposed on a second surface of the substrate, and having a dielectric layer disposed over the first conductive coating, a second conductive coating partially disposed over a first portion of the substrate and in contact with a first end of the resistive element and with a region of the second conductive coating being partially disposed over the dielectric layer and forming a first capacitor plate, a third conductive coating disposed over a second portion of the substrate and in contact with a second end of the resistive element and with a region of the third conductive coating being partially disposed over the dielectric layer and forming a second capacitor plate, whereby the first capacitor plate and a first area of the first conductive coating in conjunction with the dielectric layer form a first capacitor C1 and the second capacitor plate and a second area of the first conductive coating in conjunction with the dielectric layer form a second capacitor C2 in series with the first capacitor and the resistive element implements a resistor in parallel with the series capacitors C1 and C2, is improved by the addition of a second dielectric layer disposed over those portions of the first and second capacitor plates that are proximate to each other. In an preferred embodiment, a portion of each of the first and second capacitor plates that is farthest from where they are proximate to each other is not covered by the second dielectric layer and is therefore available as a trim area for adjusting the values of the first and second capacitors.

2 Claims, 3 Drawing Sheets

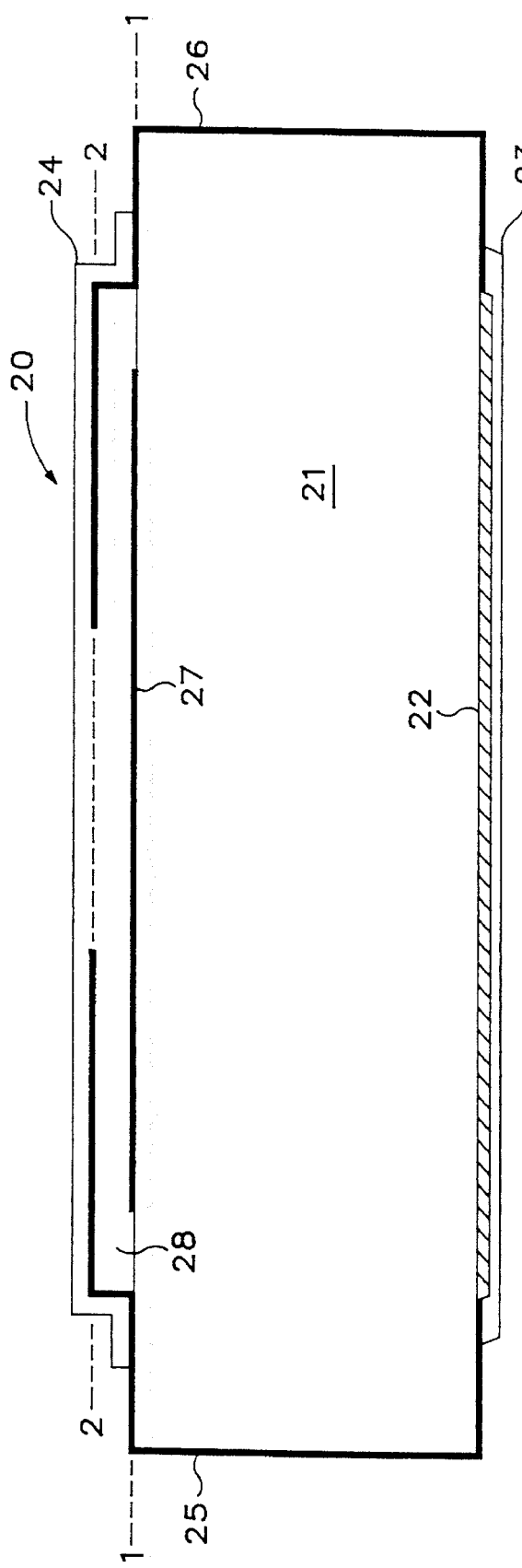
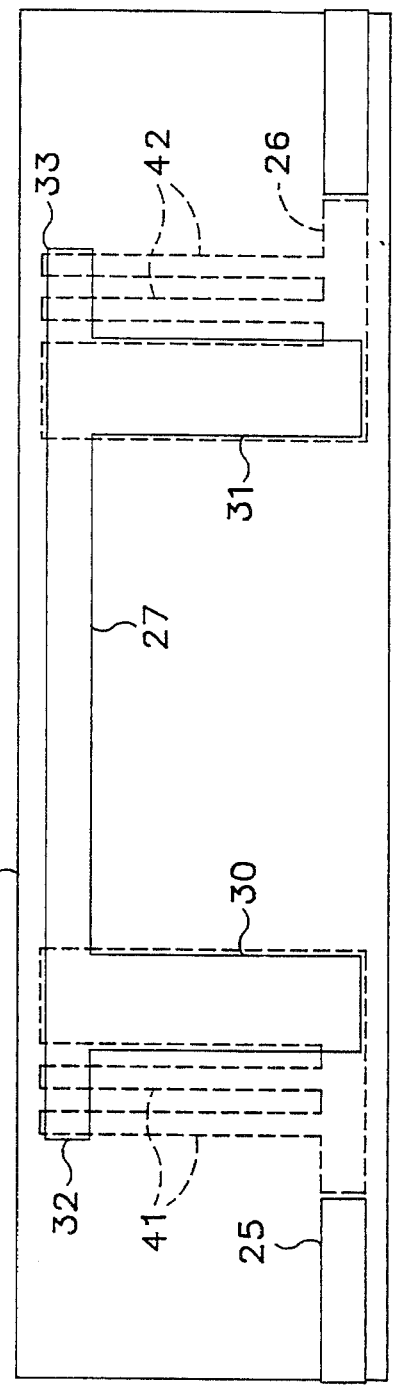
FIG. 4
FIG. 5 (PRIOR ART)

HYBRID R-C COMPONENT HAVING AN OVERLYING DIELECTRIC LAYER

FIELD OF THE INVENTION

This invention relates generally to oscilloscope probes, and more particularly to an improved hybrid component for implementing an R-C network in a manner that produces increased performance and safety for an operator using a probe containing this hybrid.

BACKGROUND OF THE INVENTION

International safety standards and a desire to make the safest possible probes for use by oscilloscope operators create a need for a probe design that can tolerate certain types of component failures without subjecting the operators to dangerous voltages. Decreasing probes sizes complicate the attainment of this objective.

Referring to FIGS. 1 & 2, passive voltage probes, such as probe 10 in FIG. 1, have previously been built using an R-C (resistance-capacitance) voltage divider component 20 fabricated using "hybrid" technology. The hybrid R-C component 20 is typically located in a cylindrical probe head housing 12 of the probe 10 and is part of a voltage divider network. In a passive probe the rest of the voltage dividing network is inside the oscilloscope proper, where active circuitry takes over the processing of the signal. One end of the hybrid R-C component 20 is electrically connected by a conductor 13 to the probe tip 14, while the other end is connected by another conductor 15 to circuitry in the oscilloscope (not shown). In a probe with active circuitry, the other end of the hybrid R-C component connects to that circuitry.

The circuit implemented by the hybrid R-C component 20 is shown in FIG. 3. The capacitance of this circuit is implemented as two series capacitors C1 and C2 so that a shorting failure of either capacitor does not lead to a short of the overall component. However, this splitting of the desired capacitance into two series capacitors means that each of the resulting capacitors has to be twice the value of the desired overall capacitance.

The prior art approach to constructing the hybrid R-C component 20 is shown in FIG. 4. The resistance R1 is implemented as resistive element 22 disposed on the bottom side of ceramic substrate 21. A first conductive coating 27 is disposed on the top surface of the ceramic substrate 21. A second conductive coating 25 electrically connects to one end of the resistive element 22 and wraps around to the top side of the ceramic substrate 21. Similarly, a third conductive coating 26 electrically connects to the other end of the resistive element 22 and wraps around to the other end of the top side of the ceramic substrate 21. The first conductive coating 27 is electrically isolated from both second conductive coating 25 and third conductive coating 26.

Dielectric layer 28 covers the first conductive coating 27 and the ceramic substrate 21 in those areas that provide electrical isolation between the three conductive coatings 25, 26, 27. Portions of both the second and third conductive coatings 25 and 26 wrap up and over dielectric layer 28 where they each form one of the plates of capacitors C1 and C2. The first conductive coating 27 also forms capacitor plates for capacitors C1 and C2, since part of it is opposite and parallel to the plate formed on top of dielectric layer 28 by second conductive layer 26 and part of it is opposite and parallel to the plate formed on top of dielectric layer 28 by first conductive layer 25. Thus, capacitor C1 is formed by a portion of first conductive coating 27 and a portion of second conductive coating 25 in conjunction with a portion of dielectric layer 28, and capacitor C2 is formed by a portion of first conductive coating 27 and a portion of third conductive coating 26 in conjunction with a portion of dielectric layer 28.

A bottom moisture barrier 23 covers resistive element 22, while a top moisture barrier 24 covers the exposed portion of dielectric layer 28 and the portions of first and second conductive coatings 25 and 26 that are in contact with the dielectric layer 28 and which form the plates of C1 and C2.

Referring next to FIG. 5, there can be seen a partially cut-away top plan view showing the relationship between the conductive coating layers that form the capacitor plates the solid lines in FIG. 5 show a partial cross-sectional view perpendicular to that shown in FIG. 4 taken at 1—1. The dotted lines in FIG. 5 show a similar partial cross-sectional view taken at 2—2 in FIG. 4.

The first conductive coating 27 includes a first capacitor plate area 30 and second capacitor plate area 31. A first extended area 32 extends from the first capacitor plate area 30 and a second extended area 33 extends from the second capacitor plate area 31. A portion (dotted lines) of the second conductive coating 25 defines a first capacitor plate area parallel to and roughly coextensive with the first capacitor plate area 30 of the first conductive coating 27. Similarly, a portion (dotted lines) of the third conductive coating 26 defines a second capacitor plate area parallel to and roughly coextensive with the second capacitor plate area 31 of the first conductive coating 27. Trim area strips 41 (dotted lines) extend from second conductive coating 25 and partially overlay the first extended area 32 of the first capacitor plate area 30 of the first conductive coating 27. Similarly, trim area strips 42 (dotted lines) extend from third conductive coating 26 and partially overlay the second extended area 33 of the second capacitor plate area 31 of the first conductive coating 27.

There are limits to the voltages that can be applied across the hybrid R-C component 20 that arise from how close together the capacitor plate formed by conductive coating 25 and the capacitor plate formed by conductive coating 26 are to each other. If these plates are kept far apart, the resulting geometries limit the total capacitance that can be produced. If these plates are fabricated too close together, the resulting structure is vulnerable to a high voltage arc over between the edges of the plates. And, since size and weight are significant issues in the design of probes, especially given the long term trend toward increasing miniaturization, an approach that allows for increased electrical safety and increased circuit capacitance is highly desirable.

SUMMARY OF THE INVENTION

The present invention is an improved hybrid R-C component of the type having a resistive element disposed on a first surface of a substrate, and having a first conductive coating disposed on a second surface of the substrate, and having a dielectric layer disposed over the first conductive coating, a second conductive coating partially disposed over a first portion of the substrate and in contact with a first end of the resistive element and with a region of the second conductive coating being partially disposed over the dielectric layer and forming a first capacitor plate, a third conductive coating disposed over a second portion of the substrate and in contact with a second end of the resistive element and with a region of the third conductive coating being partially disposed over the dielectric layer and forming a second capacitor plate, whereby the first capacitor plate and a first area of the first conductive coating in conjunction with the dielectric layer form a first capacitor C1 and the second capacitor plate and a second area of the first conductive coating in conjunction with the dielectric layer form a second capacitor C2 in series with the first capacitor and the resistive element implements a resistor in parallel with the series capacitors C1 and C2, wherein the improvement is characterized by a second dielectric layer disposed over those portions of the first and second capacitor plates that are proximate to each other. In an preferred embodiment of the invention, a portion of each of the first and second capacitor plates that is farthest from where they are proximate to each other is not covered by the second dielectric layer and is therefore available as a trim area for adjusting the values of the first and second capacitors.

BRIEF DESCRIPTION OF THE DRAWINGS

FIG. 4 is a cross-sectional view of the prior art hybrid R-C component according to the prior art.

FIG. 5 is a partially cut-away top plan view showing the relationship between the conductive coating layers that form the capacitor plates in the prior art version of the hybrid R-C component shown in FIG. 4.

DETAILED DESCRIPTION OF THE INVENTION

Figure 6:
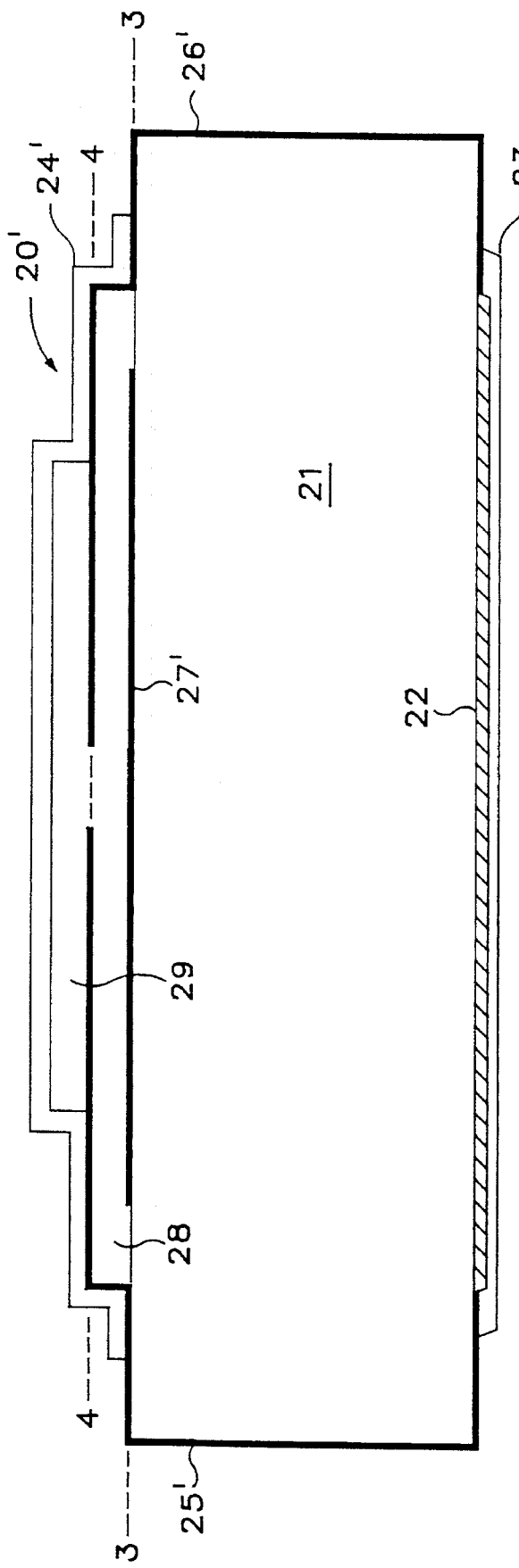
FIG. 6 is a cross-sectional view of a hybrid R-C component improved according to the present invention.

Referring now to FIG. 6, in a hybrid R-C component 20' improved according to the present invention, second conductive coating 25' and third conductive coating 26' each extend further toward the other to produce larger capacitor plates for C1 and C2, and a second dielectric layer 29 is disposed on top of the portions of both second and third conductive coatings 25' and 26' that are proximate to each other. In addition, top moisture barrier 24' now encapsulates this second dielectric layer 29 as well as portions of both second and third conductive layers 25' and 26' as it did in the prior art version of the hybrid R-C component.

The provision of the second dielectric layer 29, while conceptually simple in hindsight and easy to manufacture, yields dramatically improved performance. The hybrid R-C component of the present invention is able to achieve the same breakdown voltage rating as the prior art one, but (because so much more area is made available for capacitor construction) the capacitance value can be increased up to 10 to 20 times the value attained using the prior art approach. Alternatively, the capacitance can be left the same and the breakdown voltage could be increased by a considerable factor. The latter alternative turns out to be of limited value in the real world, since probes containing the prior art hybrid R-C component had to be designed to meet the same safety standard as the improved ones and therefore were suffering from lower than desirable capacitance values rather than of a lack of safety.

Figure 7:
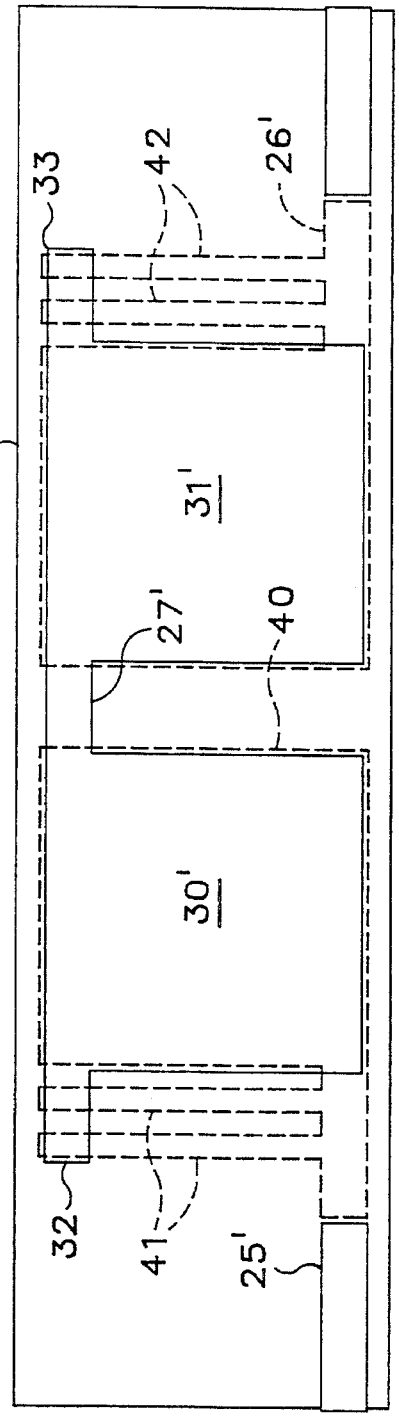
FIG. 7 is a partially cut-away top plan view showing the relationship between the conductive coating layers that form the capacitor plates according to the improvement of the present invention.

Please refer next to FIG. 7, a partially cut-away top plan view showing the relationship between the conductive coating layers that form the capacitor plates according to the improvement of the present invention. The solid lines in FIG. 7 show a cross-sectional view perpendicular to that shown in FIG. 6 taken at 3—3. The dotted lines in FIG. 6 show a similar cross-sectional view taken at 4—4 in FIG. 6.

As in FIG. 5, the first conductive coating 27' includes a first capacitor plate area 30' and second capacitor plate area 31', but now these plates are able to be much larger and closer together in accordance with the benefits of the present invention. As before, a first extended area 32 extends from the first capacitor plate area 30 and a second extended area 33 extends from the second capacitor plate area 31. A portion (dotted lines) of the second conductive coating 25' defines a first capacitor plate area parallel to and roughly coextensive with the first capacitor plate area 30' of the first conductive coating 27'. Similarly, a portion (dotted lines) of the third conductive coating 26' defines a second capacitor plate area parallel to and roughly coextensive with the second capacitor plate area 31' of the first conductive coating 27'. Trim area strips 41 (dotted lines) extend from second conductive coating 25' and partially overlay the first extended area 32 of the first capacitor plate area 30' of the first conductive coating 27'. Similarly, trim area strips 42 (dotted lines) extend from third conductive coating 26' and partially overlay the second extended area 33 of the second capacitor plate area 31' of the first conductive coating 27'. In a preferred embodiment, these trim area strips 41 and 42 are not covered by the second dielectric layer 29', thus leaving them exposed for trimming to adjust the final values of the capacitors C1 and C2 before the top moisture barrier 24' is added.

Figure 1:
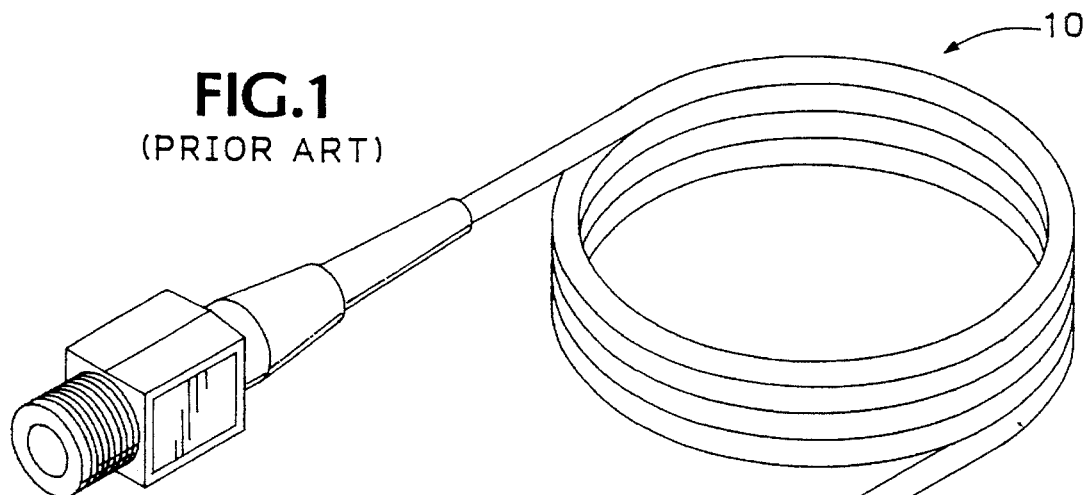
FIG. 1 is a line drawing of an oscilloscope probe.
Figure 3:
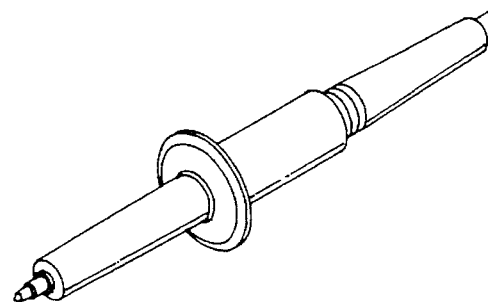
FIG. 3 is a schematic diagram of the circuit implemented by the hybrid R-C component according to both the prior art and the present invention.
Figure 2:
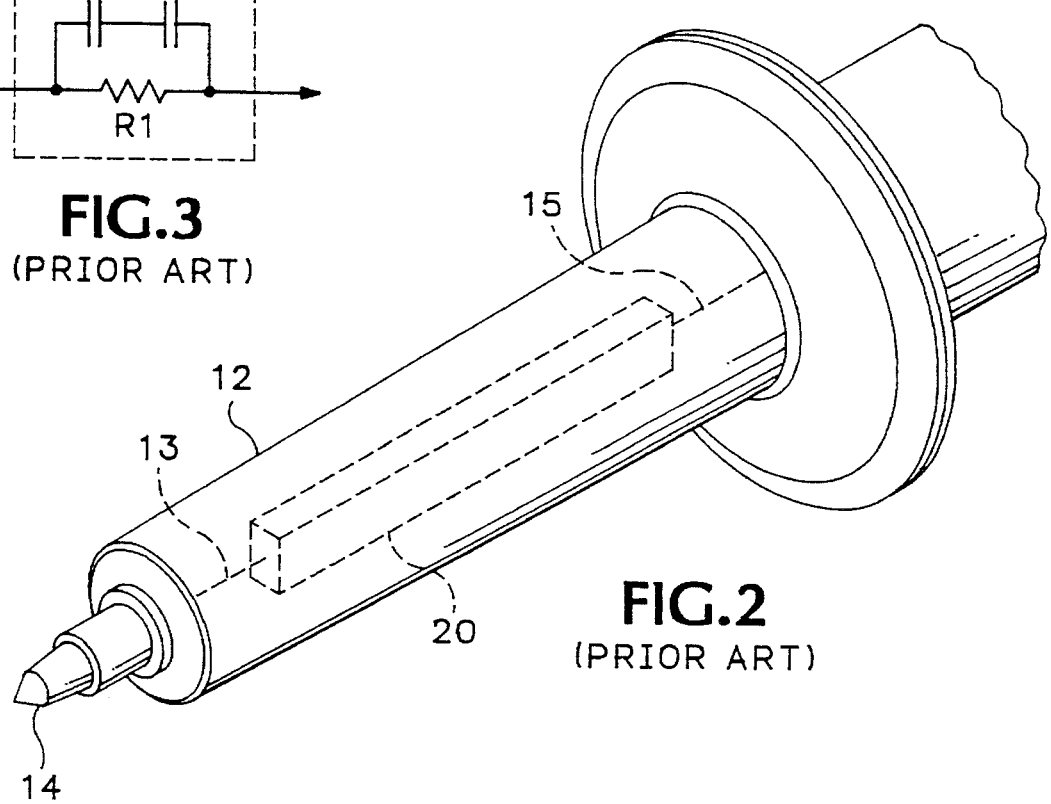
FIG. 2 is a hidden view of a hybrid R-C component according to either the prior art or the present invention disposed within a cylindrical probe head housing.

On the subject of dimensions, it should be noted that the inventive concept of the present invention is not limited to any particular set of dimensions (or materials for that matter, so long as they fit the general definitions of "dielectric" or "conductive", etc.). All of the dimensions in the Figures have been more or less distorted for clarity. Actual embodiments follow the same general approach as shown, but are much more long and narrow in order to accommodate being housed in a long, narrow, and cylindrical probe part, such as the one shown in FIG. 2. While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true scope of the invention.

We claim:

1. An improved hybrid R-C component of the type having a resistive element (22) disposed on a first surface of a rectangular substrate block (21), and having a first conductive coating (27) disposed on a second surface of the rectangular substrate block, and having a dielectric layer (28) disposed over the first conductive coating, a second conductive coating (25') partially disposed over a first portion of the rectangular substrate block and in contact with a first end of the resistive element and with a region of the second conductive coating being partially disposed over the dielectric layer and forming a first capacitor plate (30), a third conductive coating (26') disposed over a second portion of the rectangular substrate block and in contact with a second end of the resistive element and with a region of the third conductive coating being partially disposed over the dielectric layer and forming a second capacitor plate (31), whereby the first capacitor plate and a first area of the first conductive coating in conjunction with the dielectric layer form a first capacitor (C1) and the second capacitor plate and a second area of the first conductive coating in conjunction with the dielectric layer form a second capacitor (C2) in series with the first capacitor and the resistive element implements a resistor (R1) in parallel with the series capacitors (C1 and C2), wherein the improvement comprises a second dielectric layer (29) disposed over those portions of the first and second capacitor plates that are proximate to each other.

2. An improved hybrid R-C component according to claim 1 wherein a portion (41,42) of each of the first and second capacitor plates is not covered by the second dielectric layer and is available as a trim area for adjusting the values of the first and second capacitors.

* * * * *